United States Patent
Herber et al.

(10) Patent No.: US 8,042,726 B2
(45) Date of Patent: Oct. 25, 2011

(54) METHOD FOR BONDING WORK PIECES MADE OF STAINLESS STEEL, NICKEL OR NICKEL ALLOYS, USING A BONDING LAYER CONSISTING OF NICKEL-PHOSPHOROUS, METHOD FOR PRODUCING A MICRO-STRUCTURED COMPONENT USING SUCH METHOD; MICRO-STRUCTURED COMPONENT OBTAINED BY SUCH METHOD

(75) Inventors: Ralph Herber, Berlin (DE); Olaf Kurtz, Berlin (DE); Johannes Etzkorn, Berlin (DE); Christian Madry, Berlin (DE); Carsten Schwiekendick, Berlin (DE); Gerd Schafer, Berlin (DE)

(73) Assignee: Atotech Deutschland GmbH, Berlin (DE)

(*) Notice: Subject to any disclaimer, the term of this patent is extended or adjusted under 35 U.S.C. 154(b) by 458 days.

(21) Appl. No.: 12/307,939

(22) PCT Filed: Aug. 2, 2007

(86) PCT No.: PCT/EP2007/006994
§ 371 (c)(1),
(2), (4) Date: Jan. 8, 2009

(87) PCT Pub. No.: WO2008/019786
PCT Pub. Date: Feb. 21, 2008

(65) Prior Publication Data
US 2009/0202858 A1  Aug. 13, 2009

(30) Foreign Application Priority Data

Aug. 17, 2006  (EP) .................................. 06090139

(51) Int. Cl.
*B23K 31/02* (2006.01)
*B23K 35/24* (2006.01)

(52) U.S. Cl. ............... 228/200; 228/233.2; 228/254; 228/262.31; 228/262.42
(58) Field of Classification Search .................... None
See application file for complete search history.

(56) References Cited

U.S. PATENT DOCUMENTS 5,964,398 A  10/1999  Kohno et al.
(Continued)

FOREIGN PATENT DOCUMENTS

JP       02121782 A    5/1990

OTHER PUBLICATIONS

D. Brandon, W. Kaplan in Joining Processes—An Introduction, Chichester, 1 997,p. 260.Relevance is that it was cited on page 3 of the instant application.

W. Muller, J-U. Muller, in: Löttechnik Leitfaden für die Praxis, Düsseldorf, 1995, p. 167-170.Relevance is that it was cited on page 5 of the instant application.

(Continued)

*Primary Examiner* — Kiley Stoner
(74) *Attorney, Agent, or Firm* — Paul & Paul

(57) ABSTRACT

To form high performance bonding connections suitable for producing micro-structured components made of a plurality of individual layers, bonding by the steps; providing at least two work pieces; forming a metal bonding layer on at least one side of at least one of said at least two work pieces by chemical or electrolytic metal plating method; the metal bonding layer being a nickel/phosphorous alloy having a prescribed phosphorous content and prescribed thickness; forming a bonding arrangement comprising said work pieces so that there is at least one metal bonding layer between said at least two respective work pieces; heating at a prescribed heating rate to a temperature above the melting temperature of the bonding layer; bonding the two work pieces by applying contact pressure within a prescribed range; and cooling at a prescribed rate.

21 Claims, 5 Drawing Sheets

U.S. PATENT DOCUMENTS

| | | |
|---|---|---|
| 6,220,497 B1 | 4/2001 | Benz et al. |
| 6,355,589 B1 | 3/2002 | Autenrieth et al. |
| 6,672,502 B1 | 1/2004 | Paul et al. |
| 6,959,492 B1 | 11/2005 | Matsumoto et al. |
| 2003/0189087 A1 | 10/2003 | Sheng |
| 2004/0013585 A1 | 1/2004 | Whyatt et al. |
| 2004/0232211 A1 | 11/2004 | Kayser et al. |
| 2007/0006461 A1 | 1/2007 | Meyer et al. |

OTHER PUBLICATIONS

Corrosion Resistant Alloys, HAYNES International, Inc. 2003, p. 16. Relevance is that it was cited on page 6 of the instant application.

G.J. Humptson, D.M. Jacobson, in: Principles of Soldering and Brazing, ASM International, 4th Printing, Materials Park, OH, Apr. 2001, ISBN 0-87170-462-5, p. 129. Relevance is that it was cited on page 7 of the instant application.

METHOD FOR BONDING WORK PIECES MADE OF STAINLESS STEEL, NICKEL OR NICKEL ALLOYS, USING A BONDING LAYER CONSISTING OF NICKEL-PHOSPHOROUS, METHOD FOR PRODUCING A MICRO-STRUCTURED COMPONENT USING SUCH METHOD; MICRO-STRUCTURED COMPONENT OBTAINED BY SUCH METHOD

FIELD OF THE INVENTION

The present invention relates to a method for bonding at least two work pieces made of stainless steel, nickel or nickel alloys and to a method for producing a micro structured component, selected from the group including micro-reactors, micro-heat exchangers, micro-coolers and micro-mixers. In addition, the invention relates to a microstructured component, i.e., a component with fluid structures, comprising a stack of microstructured component layers made of stainless steel, nickel or nickel alloys, which are interconnected.

STATE OF THE ART

Nickel alloys include, i.e., nickel/chromium alloys, which contain less than 50% by weight iron. The said alloys are no longer considered as steels but as so-called super alloys. They are characterised by a particular corrosion resistance and high temperature stability (so-called high temperature alloys) and are based on the alloy type NiCr8020 first described in 1906 (composition: 80% by weight nickel, 20% by weight chromium). Through additions such as aluminium, titanium, molybdenum, etc., characteristics such as temperature resistance and hardness, can be influenced in a positive manner. Modern commercial names in super alloys, for example, are Inconel® (trade name of Huntington Alloys Canada, CA), Incoloy® (trade name of Huntington Alloys Canada, CA), Hastelloy® (trade name of Haynes International, US), Cronifer® (trade name of ThyssenKrupp VDM, DE) and Nicrofer® (trade name of ThyssenKrupp VDM, DE). The super alloys are used in particular in avionics, in the utility industry (for example for gas turbines), in the oil and gas industry as well as in chemical engineering, i.e., for applications in which strength at high temperatures and in highly corrosive conditions has to be guaranteed.

The production of micro-structured components, more especially made from the abovementioned nickel alloys, places great demands on the process management. Conventionally two different production paths have been described: welding methods such as thermal diffusion welding, arc welding, electron beam welding, laser welding as well as soldering methods such as soldering with silver based solder for temperature applications up to 371° C. and soldering with nickel based solder for high temperature applications. As a rule, in this case, these are ternary and quaternary systems that are provided and used in the form of powder, wax, paste or foil.

To produce metal microstructured components, the thermal diffusion welding method is widely used as the bonding technology for the metal foils to be connected, as the welding methods referred to as alternatives do not provide any possibility of forming a complete bond on the faces of the foils that are usable for this purpose. In the case of the said method, the addition of heat, and consequently the achievable bond of the foils together, are limited as regards location such that cracks can easily form in the structure of the basic material and the basic material can become deformed or respectively distorted through local overheating. This leads to a loss in dimensional accuracy for the component. To this may be added that there is no thermal coupling to any great extent between the individual layers. However, this requirement is an important reason why micro-structured components are used in heat engineering, process engineering and chemical engineering, as conductive equilibrium in the component and the most precise temperature controls in chemical processes and reactions can only be guaranteed by means of a thermal coupling between the individual layers. It is only possible to produce a plane bond that is required in this case by means of welding using the thermal diffusion welding method. In the case of the said method, the stack of sheet metal made of individual micro-structured component layers, more especially foils, is interconnected by means of pure solid state diffusion at very high pressure, at a very high temperature and at the same time at a high-vacuum that is created throughout the duration of the entire procedure.

The advantage of the diffusion welding method, above all, is that monolithic components are created through pure solid state diffusion of the basic material constituents. This means that a bonding layer is no longer recognisable in a cross section after the bonding method has been carried out, i.e., a bonding seam can no longer be visible. The result of this is that the region, in which a bonding layer was situated before the bonding method took place, is no longer different to the basic material or is no longer substantially different to the basic material once the method has been carried out and consequently has the same characteristics as the basic material.

In order to accomplish interdiffusion (diffusion of constituents between different component parts, for example between bonding layer and component layer) between the components to be bonded, it is necessary during the diffusion welding process to apply a very high temperature, a very high contact pressure (for example 20 MPa, D. Brandon, W. Kaplan in *Joining Processes—An Introduction*, Chichester, 1997, Page 260) as well as a high vacuum to avoid the formation of oxide layers in the bonding region. Over and above this, high demands are made on the surface quality of the component parts to be bonded, more especially with regard to roughness, cleanness of the surface, and accuracy of form/planarity. In addition, there are restrictions on the selection of materials and on the combination of materials as, as a rule, where demands are made on the high temperature resistance of the basic material, the necessary minimum temperature during the diffusion welding process also rises.

More especially in the case of high temperature materials, the expenditure on hardware for diffusion welding rapidly becomes disproportionately high. This refers not only to the temperature generation itself and to the size of the system (furnaces) but also more especially to the generation of a uniform contact pressure exerted onto the component layers. If, on account of the high temperature necessary, conventional press rams can no longer be used, fixing devices have to be employed. Pressure generation with fixing devices is based on the principle of different coefficients of thermal expansion. Whereas the said method is still controllable in the case of small components with edge lengths of few centimeters, the difficulties with larger components very rapidly become insurmountable. The reason for this is that it is no longer possible to obtain the absolutely necessary uniform distribution of contact pressure over the entire component. Possible consequences are deformation of narrow webs between ducts in the component layers, distortion of the components and leakages.

The expenditure on hardware is high due to the combination of a very high temperature, pressure and high vacuum and is linked with a plurality of technical problems (no suitable commercial systems (high temperature pressing tools)). Consequently, this method cannot be economically justified.

For these reasons soldering/brazing methods have been put forward as alternative methods for the production of microstructured components (DE 198 01 374 C1). However, soldering methods always have the principle disadvantage that the solder, as the bonding layer between the component layers to be bonded, is produced from a material that is different to the material of the stacked layers. The solder also introduces foreign materials which alter the characteristics of the basic material, such as strength and corrodibility or respectively corrosion resistance, and influence them in a negative manner. A cause of this is, i.a. the formation of intermetallic phases during the soldering process, the number, size and distribution of which can negatively influence the characteristics of the basic material and consequently that of the bonded component in a lasting manner. The solder constituents, consequently, have to be adapted correspondingly to the compositions of the basic materials and the selected solder conditions. In any case, with these types of methods no monolithic components are created, i.e., with bond connections, where the seams are no longer detectable in a cross section.

In the case of high temperature soldering, more especially with the use of nickel based solders, the formation of brittle hard phases presents a particular danger. Thus additions of phosphorous, boron and carbon can result in the forming and stabilising of comparatively large amounts of brittle phases and consequently in the reducing of the ductility and strength as well as of the corrosion resistance of the basic materials. Phosphorous with the transition metals chromium, iron and nickel, forms very brittle and refractory intermetallic $Me_3P$-phases (phosphides) in the solder structure. However, the alloyed metalloids boron, silicon and phosphorous are a central constituent of many nickel based solders, as through them the high melting points of the nickel and nickel/chromium solders are lowered to controllable process temperatures. To this may be added positive effects on the wetting and flowing behaviour of the solders as well as their capillary ability to fill gaps.

A long soldering process or subsequent tempering or respectively annealing promotes solid state diffusion of the formed hard phases and consequently their dissolution in the basic material. This method of operation is in all cases connected to considerable extra costs, and disadvantageous effects, such as alloying the basic material or forming coarse grains, have definitely to be avoided. To this may be added that it is not possible to check the completeness of the dissolution of the formed brittle phases in a non-destructive manner and that the basic materials have to be exposed to the high temperature after soldering has been performed.

Consequently, modern process management attempts to avoid this "diffusion annealing" and to generate an extensively brittle-phase-free bonding zone through an optimised coordination between the solder/brazing-basic material combination and the process parameters. The aim is to make a soldering/brazing joint so narrow that the soldering/brazing joint clearance is below the critical soldering/brazing joint clearance (KLB) produced from the said coordination in the bonded component. The KLB indicates at which soldering/brazing joint clearance a largely brittle-phase-free soldering/brazing joint can be expected. Where nickel based solders are used the rule of thumb is KLB<50 µm and for nickel based solders containing phosphorous KLB<10 µm.

For example, W. Müller and J.-U. Müller, in Löttechnik—Leitfaden für die Praxis (*Soldering/brazing—An Instruction Manual*), Düsseldorf, 1995, Pages 167-170, state that it is not possible to obtain any notable improvement in strength through a post-tempering process or respectively a gap-minimising using nickel based solders containing phosphorous. The diffusion coefficients of the combination of phosphorous/basic material are considered be so small that the critical soldering/brazing joint clearances are far below 10 µm and could hardly be realised in practice. The components produced with nickel based solders containing phosphorous would consequently be less suitable for dynamic loads.

Soldering/brazing methods, however, from a production engineering and a cost point of view, provide some fundamental advantages, such as the possibility of using industrially produced presses, the possibility of being able to bond together even component layers with poor surface quality, to combine different materials together and to avoid local overheating and cracking in the basic material. In addition, numerous bonding regions on one component and consequently also components with large surface areas and comprising a plurality of individual functional layers can be bonded in one process step. Although soldering/brazing methods have been proposed many times already as a bonding method for microstructured components, up to now there has been no success in using conventional soldering/brazing methods for the industrial production of such types of components, as additional requirements have to be met for their production compared to the diffusion welding method: On the one hand, no solder may pass into the micro-structured ducts in the component layers during the melting process and block the ducts. Contrary to many soldering/brazing methods, on the other hand, there must be no fluxing agent used as flux residue cannot be removed from the finished component or can only be removed at great expense. Flux residue not only presents unwanted contamination in the reactor, but is also the cause of corrosion. Particularly critical in this case are soldered/brazed joints on narrow webs in the component layers.

This is the reason why up to now components made from nickel, nickel alloys or stainless steel are preferably welded. The use of solder pastes, which are to be free of phosphorous in particular, is proposed as an alternative. Such solders comprise, for example, alloys that contain gold, cadmium, zinc and copper and are described in: *Corrosion Resistant Alloys*, Haynes International Inc. 2003, Page 16, in order to bond Hastelloy® alloys.

It is clear from the above embodiments that the expert would not use bonding layers made from nickel/phosphorous alloys to bond stainless steels, nickel or nickel alloys on account of the disadvantages described.

In the case of classic soldering/brazing, in dependence on the bonding temperature between soft-soldering ($T_f$<450° C., $T_f$: bonding temperature), brazing (450° C.<$T_f$<1100° C.) and high temperature brazing ($T_f$>950° C.), brazing is considered as a special case. Different solder materials are used, in this case, in the various temperature ranges. Their respective melting ranges are clearly more or less below that of the basic material to be bonded. When the soldering/brazing temperature has been obtained, the solder melts, wets the surfaces of the materials to be bonded and effects its adhesive connection once it has cooled. In classic soldering/brazing procedures, consequently, the solder layer formed in this manner always comprises a material that differs to that of the work pieces. The different physical characteristics resulting therefrom, of the solder on the one hand and of the basic material on the other, for instance different coefficients of thermal expansion, different electrochemical potentials and the different corrosion behaviour this leads to, different structures as well as the different hardness and ductility are fundamental disadvantages that are, however, more or less serious depending on the application and area of use of the component, that-is-to-say, they are acceptable disadvantages.

One method that is suitable for soldering/brazing micro-structured sheet metals is described in DE 198 31 374 C1. The said method has the following sequence: creating a stack made from the sheet metals and solder layers, which are between respective two adjacent sheet metals, the layer thickness of the solder layers being 3-25 μm, and soldering/brazing the stack in the vacuum or in an inert atmosphere by adding heat. NiP (nickel/phosphorous) alloys with a phosphorous content of 7-14 percent by weight is suggested, for example, for the solder layer. The solder layer can, among other things, be applied to the sheet metals by means of electroplating. The soldering/brazing temperature is within a range of from 720 to 1280° C. The said method does not result in monolithic components but in the formation of bonding zones just as in the case of classic soldering/brazing with the corresponding risk of the forming of brittle hard phases. This causes the above-mentioned disadvantages.

The fundamental problems that are produced when using a soldering/brazing method through the difference in the material between the bonding layer and the basic material cannot occur in the case of monolithically bonded components due to their nature. A monolithic structure can be created when bonding takes place at a sufficiently high temperature, such that components of the bonding layer and of the basic material diffuse into one another and the concentration gradients of the existing elements, initially created, gradually disappear (G. J. Humpston, D. M. Jacobson, in: *Principles of Soldering and Brazing*, ASM International, 4$^{th}$ Printing, Materials Park, Ohio, April 2001, ISBN 0-87170-462-5, Page 129). Monolithic components, consequently, are generally only obtained by means of the afore-discussed difficult high temperature bonding method, such as the diffusion welding method, which is technically very time-consuming and expensive.

U.S. Pat. No. 6,672,502 B1 relates to a method for producing a monolithic intermetallic structure. The method comprises the method steps: providing plates, which comprise first and second metal layers, structuring the plates, stacking and registering the structured plates, connecting a plurality of plates in the stack and processing the stack forming an inter-metallic structure. Aluminium and nickel alloys are used, for example, as the metal layers. These, where applicable, are structured using a suitable method and are then stacked or are stacked first of all. In the subsequent processing of the stack forming the intermetallic structure, a monolithic intermetallic structure is formed. However, the bonded components are extraordinarily brittle as the structure formed in this case comprises an intermetallic phase. To this end, a plurality of plates made of different metals in a stoichiometric ratio are combined and bonded together. Consequently, the formed bond has unsatisfactory material characteristics, more especially low mechanical strength under dynamic loads.

Further, EP 1 136 782 A1 refers to a plate heat exchanger comprising a pair of end plates and a plurality of plates sandwiched between said pair of end plates and having two passageways defined therein that are not in fluid communication with each other. Two fluids flow through the two passageways in a countercurrent fashion. The plates are made of for example stainless steel and soldered to one another using solder material which may be electroless plated to the plates with nickel/phosphorous solder. For joining the plates together the deposits are fused.

Further U.S. Pat. No. 5,964,398 refers to a method for producing a joint between a first member and a second member, using a solder for producing a vane. The assembly is soldered at a temperature above the melting temperature of the solder such that mutual diffusion is caused by heating the assembly and such that the base component of the solder becomes substantially identical to the base components of the first and second members and such that the mechanical strength and characteristic of the heat treatment of the joint become substantially equal to those of the first and second members. The first and second members may be made from Cr steel. The solder may be of nickel/phosphorous having 9-10 percent of weight phosphorous and having a thickness of about 3 μm (actual thickness 2-5 μm). The nickel/phosphorous layer may be electroless plated. For joining, the assembly may be heated to 1050° C. and pressed applying a compression surface stress of about 0.1 kg/mm$^2$.

Further, US 2004/0013585 A1 refers to a heat exchanger comprising a plurality of first and second microchannels for conveying first and second fluids, respectively, wherein the first and second microchannels are in thermal contact with each other. The heat exchanger may be formed from stainless steel or high nickel alloys such as Inconel. Bonding of stacked shim/end clock assemblies into a single solid piece made of metal may be a high temperature/high pressure diffusion bonding process. Various coatings may be applied to assist bonding of the shims. For example, electroless nickel plating can be performed in conjunction with the diffusion bonding for bonding stainless steel shims, using a nickel plating bath containing sodium hypo phosphite as the reducing agent. For stainless steel, bonding may be performed at 920° C. and 4000 pounds per square inch for 4 hours for example.

Further, JP 02121782 A discloses forming plated layers on joining faces of members to be joined by wet plating consisting of ≧3 elements in all with ≧1 element among nickel and others and ≧1 element among P and others having two elements at a eutectic point.

SUMMARY OF THE INVENTION

Against this background, one object of the present invention is to provide a method for bonding work pieces made from stainless steel, nickel or nickel alloys.

A further object of the invention is to provide a method for bonding the work pieces that can be carried out in an economical manner.

A further object of the present invention is to provide a method for bonding the work pieces where the advantageous characteristics of the stainless steel, nickel or nickel alloys are maintained.

Yet another object of the present invention is to avoid the disadvantages of the welding method, more especially its high costs and high expenditure on hardware.

Yet another object of the present invention is to provide a method for bonding micro-structured work pieces and more especially to avoid micro-structures in the components to be bonded becoming obstructed by soldering/brazing material of the bonding layer.

Yet another object of the present invention is to provide a method for producing a micro-structured component.

Finally, an object of the present invention is to prepare a micro-structured component made from micro-structured component layers.

These objects are achieved through the method for bonding at least two work pieces made of stainless steel, nickel or nickel alloys according to claim 1, the method for producing a micro-structured component according to claim 21 and the micro-structured component according to claim 22. Preferred specific embodiments of the invention are specified in the sub claims.

In the present application, the term "work piece" refers to a structural element that has a form that is suitable for an intended application, for example a plate, foil or sheet metal. The work pieces according to the invention are made from stainless steel or nickel or a nickel alloy. If several work pieces are combined and bonded together to form one component, the work pieces combined together can be made from identical or different materials. For example, work pieces made from various nickel alloys can be combined and bonded together.

In the present application the term "component" refers to a product that is formed from several work pieces by means of bonding. The component itself can be a finished product or a semi-finished product. For example, the component can be a semi-finished product for producing a micro reactor, micro heat exchanger or micro mixer.

In the present application the term "micro-structured components" refers to such components that have structures, above all fluid structures. The depth of the said structures is within a range of from 50 to 10000 μm, more especially within a range of from 50 to 2500 μm. These types of components are used more especially as micro-structured reactors (micro-reactors), mixers (micro-mixers) and heat exchangers (micro-heat exchangers).

In the present application the terms "micro-reactor", "micro-mixer" and "micro-heat exchanger" refer to micro-structured components that include duct structures for fluids. The micro-heat exchangers have two duct structure systems that are separate from one another, between which there is no fluid connection, which, however, are in close thermal contact so that heat can pass from the fluid flowing in one duct system to the fluid in the other duct system. Cross heat exchangers, for example, are known, which have duct structures that are disposed crosswise over one another and are associated with the two duct systems in an alternating manner. Micro-mixers usually have only one duct system: At least two fluids, which enter the mixer via respective inlets, pass into a mixing chamber system where they are mixed. The mixed fluid passes out of the mixer through a single outlet. Micro-reactors usually also have only one such duct system. The reactors can also include, i.a., micro mixers and micro-heat exchangers in order to mix or respectively pre-heat or pre-cool reactants or subsequently to heat or to cool the said reactants. Reactants, which, where applicable, have been mixed and, where applicable, heated or cooled, are chemically reacted in a reactor chamber. The aforementioned components can include additional elements, such as sensors, actuators and heating and cooling elements. All duct structures mentioned have the dimensions mentioned for micro-structured components. Micro-reactors, micro-heat exchangers and micro-mixers are used, above all, in chemistry, i.a., in industrial chemistry, for example medical engineering and chemical reaction engineering, as well as in automotive engineering.

In the present application the term "indentations" relates to recesses in the work pieces, more especially in the foils or sheet metals, which are elongated for the forming of ducts and do not completely penetrate the work pieces, and to perforations, which do penetrate the work pieces completely for the forming of passages between different layers. Other indentations and perforations are also possible, for example recesses that are not elongated and that do not completely penetrate the work pieces or elongated perforations (which do completely penetrate the work pieces). When the micro-structured layers are stacked, passages are formed form the indentations contained therein.

In the present application the term "passages" relates to fluid flow paths in a micro-structured component, the said fluid flow paths either extend internally of a component layer (ducts) or penetrate the component layer (connecting ducts). Other passages are also possible, for example mixing chambers and reaction chambers.

In the present application the term "fluid" refers to a liquid or a gas.

In the present application the term "electrolytic metal plating method" relates to a method for producing a metal layer on a base using a wet-chemical (electroplating) method, where the metal layer is formed on the surface of the work piece from a chemical processing liquid, for example a solution, suspension or dispersion, by using an electric current between the base and a counter electrode (anode). For example, copper can be deposited electrolytically from a sulphuric acid copper sulphate solution. Other metals and metal alloys can also be deposited in the same way, for example nickel, cobalt, chromium, zinc, tin, lead, iron, gold, palladium, rhodium, platinum, silver and cadmium.

In the present application the term "chemical metal plating method" refers to a method for producing a metal layer on a base using a plating method where the metal layer is formed on the surface of the work piece from a chemical processing liquid, for example a solution, suspension or dispersion, without using an electric current. The difference is made between (external) electroless/autocatalytic methods where, for metal plating, reducing agents are used for the reducing of metal ions to metal forming the metal layers and immersion plating methods where no such reducing agents are used. In the case of the electroless methods, the plating liquid is metastable against decomposition. In the case of the immersion plating methods, the metal ions are reduced by means of a charge exchange reaction between the said ions and a metal base, on which the metal layer is deposited, by the metal of the base being dissolved by oxidation and the metal ions being deposited by reduction (depositing through charge exchange reaction). For example, nickel and its alloys with metalloids and copper can be deposited in an electroless manner. Sodium hypophosphite and its acids, dimethyl amino borane and sodium borohydride and formaldehyde can be used as reducing agents. A preferred electroless nickel plating solution contains a nickel salt, for example nickel sulphate, and sodium hypophosphite as the reducing agent. In addition, tin can be deposited, for example, using an immersion plating method on copper surfaces if the plating solution contains thiourea. In this case, copper dissolves and tin is deposited.

DETAILED DESCRIPTION OF THE INVENTION

The present invention is suitable for producing micro-structured components. According to a first aspect, the present invention relates to a method for bonding at least two work pieces, which are made of stainless steel, nickel or nickel alloys. The said method includes the following method steps:

a) providing said at least two work pieces;
b) forming a respective metal bonding layer on at least one side of at least one of said at least two work pieces by means of a chemical or electrolytic metal plating method, wherein the metal bonding layer consists of a nickel/phosphorous alloy having a phosphorous content within a range of from 1 to 14 percent by weight, preferably within a range of from 8 to 12 percent by weight, and a thickness within a range of from 0.5 to 10 μm;

c) forming a bonding arrangement of the work pieces in such a manner that there is at least one metal bonding layer between said at least two respective work pieces;

d) heating the bonding arrangement at a heating rate of from 5 to 30 K/min to a bonding temperature in excess of the melting temperature of the metal bonding layer;

e) bonding said at least two work pieces at the bonding temperature by applying a contact pressure within a range of at least 10 kPa and preferably up to 5 MPa, more preferably up to 2 MPa, even more preferably up to 1 MPa, even more preferably up to 300 kPa and is most preferably from 20 kPa to 300 kPa; and finally f) cooling the bonding arrangement at a cooling rate within a range of from 10 to 100 K/min.

According to a second aspect, the present invention relates to a method for producing a micro-structured component, selected from the group comprising micro-reactors, micro-heat exchangers and micro-mixers. The said method includes the following method steps:

a) carrying out the bonding method according to the invention for the work pieces, wherein the work pieces are provided before method step (c), more especially before forming the bonding layer on the work pieces (method step (b)), with indentations for forming passages;

b) providing connecting means for the inlet and outlet of fluids into the passages or respectively out of the passages.

The work pieces, in this case, are preferably metal foils or sheet metal. The metal foils or sheet metal provided with the bonding layer are disposed in a stack and are then bonded. On the outer sides the stack includes outer foils or outer sheets (outer layers) and there-between inner foils or inner sheets (inner layers). The one outer foil or the one outer sheet is a bottom foil or respectively a bottom sheet, and the other outer foil or the other outer sheet is a top foil or respectively a top sheet. The indentations in the work pieces form the passages once the work pieces have been connected. The connecting means for the inlet and the outlet of fluids into the passages or respectively out of the passages can be more especially connection pieces, to which hoses, tubes, capillaries or other external liquid conducting means can be connected.

According to a third aspect, the present invention relates to a micro-structured component. The component includes a stack of micro-structured component layers, which are bonded together through the intermediary of at least one bonding layer by forming bonding connections using the bonding method according to the invention, the said component layers being produced from materials selected from the group comprising stainless steels, nickel and nickel alloys, as well as connecting means for the inlet and outlet of fluids into passages in the stack or respectively out of the passages.

In a preferred specific embodiment according to the invention, the bonding arrangement is heated to a bonding temperature within a range of from 880 to 1200° C. The bonding temperature depends, on the one hand, on the type of base material of the work pieces and, on the other hand, on the type of solder material used. As the solder material is a nickel/phosphorous alloy, the selected bonding temperature is in excess of the melting temperature of the nickel/phosphorous alloy (approximately 880° C. for an alloy having a phosphorous content of 11.5 percent by weight). The selected temperature range presents a compromise between the demand to select the bonding temperature as high as possible, on the one hand, in order to enable rapid diffusion of the solder constituents into the work pieces and of the work piece material into the soldering/brazing joint, and, on the other hand, to select it only as high as is necessary in order to avoid damaging the work piece, which can occur causing cracks to form in the structure of the basic material of the work pieces if the bonding temperature is too high and causing the basic material to deform or respectively distort due to local overheating.

The method according to the invention provides a bonding technique that does not have the disadvantages of the known bonding methods with regard to mechanical stability and corrosion resistance. Without being restricted with regard to the scope of the invention, it is assumed that the surprisingly high resistance of the components produced using the method according to the invention can be obtained by the bonding layer being thin and by, consequently, with the soldering/brazing conditions selected according to the invention, a largely monolithic bond being formed between the bonding layer and the stainless steel, nickel or nickel alloy basic material without compromising the characteristics of the basic material.

The specially adjusted soldering/brazing parameters according to the method according to the invention are more especially the heating rate of the bonding arrangement to the bonding temperature, the contact pressure as well as the cooling rate after the bonding process.

In one variant according to the invention, the bonding arrangement is first of all heated to a lead temperature within a range of from 700 to 900° C., which is lower than the bonding temperature and lower than the melting temperature of the bonding layer, and is then heated to the bonding temperature. This is more especially to heat the bonding arrangement thereafter as uniformly as possible to the bonding temperature. In order to guarantee that this is effected as well as possible, it is possible to hold the bonding arrangement at the lead temperature until the entire bonding arrangement has reached the lead temperature (in a bonding furnace). The said dwell time can be within a range of from 0 to 3 h. Consequently, it is also possible to continue heating up the bonding arrangement to the bonding temperature directly the lead temperature has been reached without dwelling at the lead temperature. In a preferred variant of the said specific embodiment, the bonding arrangement is heated to the lead temperature at a heating rate of from 5 to 30 K/min. Once the lead temperature has been obtained, the arrangement is then heated at another heating rate, which is preferably lower than the heating rate to obtain the lead temperature, until the bonding temperature is reached. It has been shown that the material characteristics of the bonding arrangement can be improved further by means of this additional step.

The bonding layer is formed according to the invention using either a chemical or an electrolytic method. It has been proven that the bonding layer is formed preferably using an electroless metal plating method. The said method of operation has proved to be advantageous because thin metal layers can be formed above all with uniform metal layer thicknesses using the said method. Very thin layers can also be produced using electrolytic methods. However, the uniformity depends on geometric boundary conditions during the electrolytic depositing method, more especially on the location of the work piece in the plating bath and above all on its location relative to the location of the counter electrode, as well as on the form of the work piece and the location and the dimensions of indentations on the work piece.

The bonding method according to the invention is used for bonding work pieces made from stainless steel, nickel and nickel alloys, nickel super alloys being used preferably, i.e., nickel base alloys where the content of nickel is at least 28 percent by weight, especially preferred within a range of from 50 to 90 percent by weight, preferred most of all within a range of from 50 to 80 percent by weight. Particularly suitable nickel super alloys contain less than 50 percent by weight iron. These materials are suitable above all for the production of micro-structured components. This suitability is due to the thermal and corrosion resistance of the said materials.

In the case of the method according to the invention, the work pieces are interconnected by means of a bonding layer with no joint. The bonding layer is for creating an internal bond between the surfaces of the work pieces. By using the bonding layers, it is possible to obtain a very firm bonding connection especially when the constituents of the bonding layer diffuse into the bonding partners, the work pieces, and when the constituents of the work pieces diffuse into the bonding layer. This is guaranteed by the method according to the invention.

The mounting of the bonding arrangement is effected preferably using one of the two following method variants:

The work pieces are preferably disposed in a stack and are inner layers and outer layers that enclose the said inner layers, with inner sides that are in contact with the inner layers.

In a first preferred method variant, at least one metal bonding layer is formed over the entire surface of at least one side of the respective inner layers and at least one metal bonding layer is formed only on the inner sides of the respective outer layers.

In order to protect the outer side of an outer layer in the said specific embodiment against the depositing of the bonding layer, a resist can be applied onto this side which means that no bonding layer is deposited at that location. Once the bonding layer has formed exclusively on the inner side of the outer layer, the resist is removed again (stripped off).

In a second preferred method variant, at least one metal bonding layer is formed over the entire surface of at least one respective inner layer, and no bonding layer is formed on the outer layers.

By placing the bonding layer between the work pieces and more especially by forming the bonding layer using a chemical or electrolytic method on the surfaces of the work pieces, it is possible to create extraordinarily flat, smooth surfaces on the work pieces. This is extraordinarily advantageous for a rapid, firm connection between the work pieces. Even if the surfaces of the work pieces are not extremely flat and smooth before the bonding layer is applied, it is possible for the bonding faces to obtain the desired characteristics by means of suitable method management. The method conditions that are required for creating the desired characteristics are known (selection of suitable chemical processing solutions which have a so-called levelling effect). More especially, by using chemical and electrolytic methods, very flat, smooth surfaces can be created even if the non-coated surfaces of the work piece do not satisfy these requirements. It is also advantageous that thin layers (few μm thick) more especially can be formed using these methods.

In the case of the method according to the invention, largely monolithically bonded components are created i.e., components where a bonding seam is no longer visible as there are no longer any boundary faces. Consequently, the region in which the bonding layer was situated before the bonding method was carried out, once it has been carried out, no longer differs or does not differ substantially from the basic material and consequently has substantially the same characteristics as the basic material. Intermetallic phases, which do not however form a contiguous seam and are below the critical phase of expansion of 100 μm, can be built up individually to a small extent depending on the selection of the soldering/brazing conditions. Such a monolithic construction has the required high mechanical fatigue strength even under thermal load as well as the desired resistance to corrosion. The high strength more especially under thermal load, in this case, is achieved above all by the coefficients of expansion of the individual materials, which were present originally in sandwich form, adjusting to each other during the diffusion procedure, such that in the event of a seamless bond, there are no longer any gradients in the coefficients of expansion.

The bonding temperature is, according to the invention, above the melting temperature of the bonding layer. The bonding temperature depends on the diffusion coefficients of the respective components and consequently on the melting temperature of the bonding material; however, it is also dependent on the melting temperature of the basic material of the work pieces. In the event of an amorphous alloy of 11.5 percent by weight phosphorous in nickel for the metal bonding layer, its melting point is approximately 880° C. The preferred bonding temperature, in this case, is from 1050 to 1150° C.

The bonding layer preferably has a thickness within a range of from 0.5 to 10 μm, more especially preferably from 2 to 5 μm and preferred most of all from 1 to 2 μm. Selecting a very small thickness suppresses the formation of brittle phases. As the bonding layer according to the invention is very thin, the alloy constituents of the bonding layer diffuse into the regions abutting against the bonding faces of the work pieces. On account of the short diffusion distance, the diffusion takes places rapidly such that a tight bond between the work pieces and the bonding material is created very quickly. The bonding material then is at least extensively absorbed in the work piece material if the bonding process lasts long enough. Since on account of the small layer thickness there is only a relatively small amount of bonding material available, it is natural that only very small amounts of the constituents of the bonding material need to be diffused into the work pieces. Constituents of the material, which make up the work pieces to be bonded, can also be diffused into the bonding seam which means that the elements are interdiffused overall.

In order to produce a monolithic or almost monolithic component from the bonding partners, i.e., a component with a seamless or largely seamless bond, the work pieces of the bonding arrangement can be bonded at the bonding temperature for at least the length of time that it takes until the bonding layer is hardly still visible or is not visible at all in a cross section. In such a case, all the bonding seams, by means of diffusion of the constituent parts of the bonding layer and of the bonding partners, have completely or almost completely disappeared. This forms a high-performance bond that is corrosion resistant.

The length of time required for the bonding process in order to produce the component is dependent on the type of the material that makes up the work pieces, and on the material that makes up the bonding layer, in addition it depends on the bonding temperature and on the contact pressure at which the bonding partners are pressed together during the bonding process. The length of time required for the bonding process in the method according to the present invention is preferably from 15 min to 4 hours. Especially preferred is a bonding duration within a range of from 45 to 90 min. The higher the bonding temperature, the shorter the length of time required for bonding.

Optimisation of the mechanical strength of the bond, in addition, is achieved in that the bonding arrangement is exposed to an increased contact pressure during the heating process (heating and/or holding phase during the bonding process at the bonding temperature). This means even the smallest unevenness on the bonding faces can be evened out.

The contact pressure is within a range of at least 10 kPa and preferably up to 5 MPa, more preferably up to 2 MPa, even more preferably up to 1 MPa, even more preferably up to 300 kPa and is most preferably from 20 to 300 kPa.

The heating and cooling rates also have a decisive influence on the forming of the intermediate phase, the ageing and the size of the grains in the structure of the work piece. The relatively rapid cooling process reduces the grain growth and at the same time should be adjusted to the reduction in the build-up of inner tension in the structure of the component. The cooling rate, consequently, according to the invention, is within a range of from 10 to 100 K/min, preferably from 15 to 25 K/min.

More especially in the production of micro-structured components made from component layers, the work pieces can include at least one respective bonding region in which one of the work pieces can be bonded to another one. The bonding partners are then interconnected by means of one or several respective bonding regions that abut against each other on the component layers. In this case, it has been proven advantageous for the bonding layer to be placed exclusively at the positions in the bonding arrangement (in the bonding regions) in which the components are to be interconnected by means of the bonding faces. The bonding layer is accordingly only applied selectively to the bonding faces (in the bonding regions) of the bonding partners, not however to other surfaces of the work pieces. In order to form the bonding layer selectively only in the bonding regions, a resist technology can be used where the regions on the work pieces that do not correspond to the bonding regions are covered by the resist and the bonding layer is then formed in the exposed (bonding) regions. The resist can later be removed again.

The Examples and Figures described below explain the invention in detail.

In FIGS. 2-6, the horizontal arrows in each case show the position of the former bonding layer made of nickel/phosphorous alloy.

Figure 1:
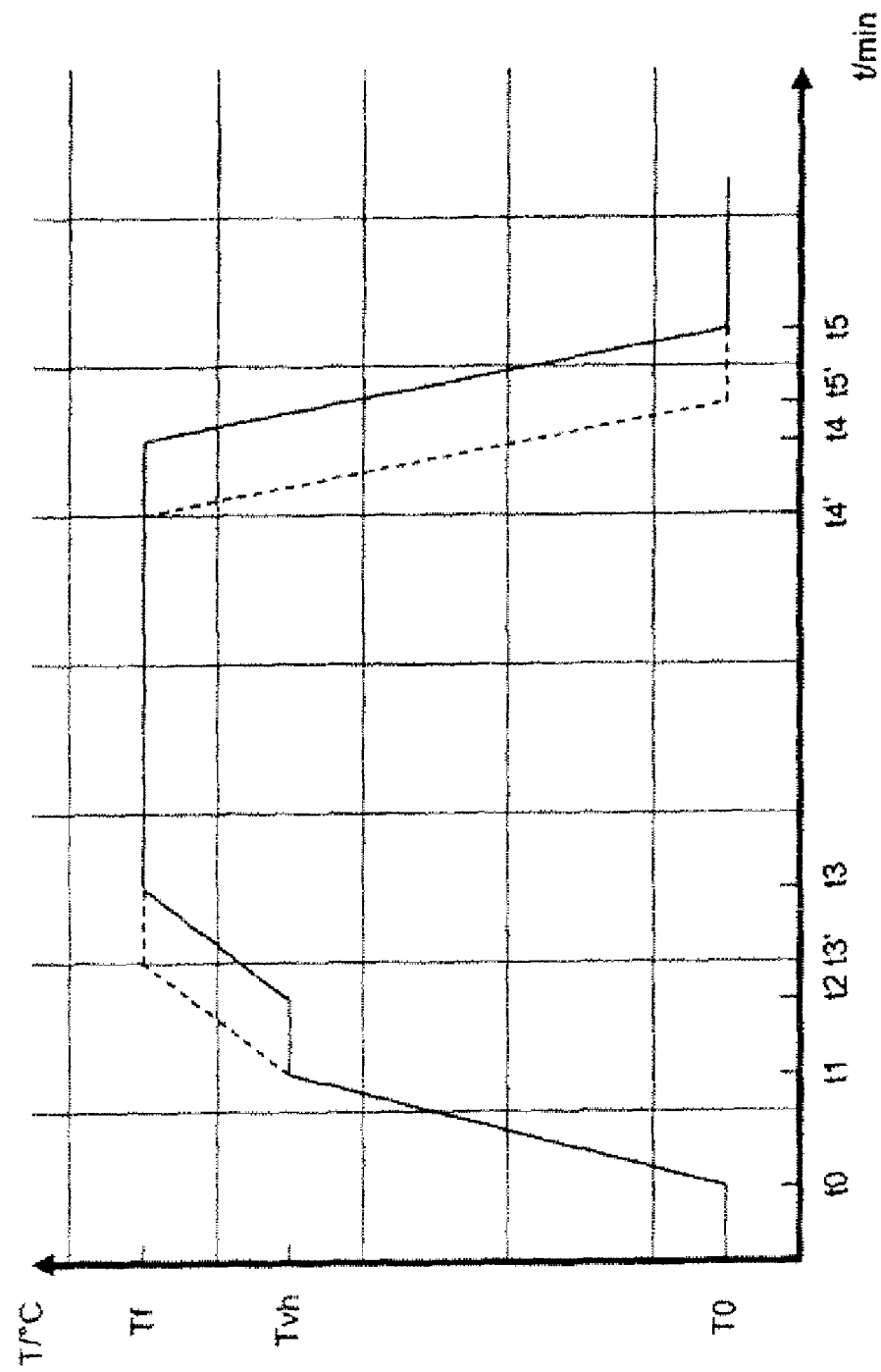
FIG. 1 shows a schematic representation of the temperature curve during the bonding method.

FIG. 1 is a schematic representation of a typical temperature curve during the bonding of work pieces. The representation is a graph with one ordinate as the temperature axis [T/° C.] and one X axis as the time axis [t/min]. Proceeding from a start temperature $T_0$, which is conventionally room temperature, at the point in time $t_0$, a bonding arrangement is initially heated at a predetermined heating rate to a lead temperature $T_{vh}$. The bonding arrangement reaches the lead temperature $T_{vh}$ at the point in time $t_1$. If the bonding arrangement is held at the lead temperature $T_{vh}$ for a dwell time of $t_2-t_1$ the curve follows the continuous line in FIG. 1. If, contrary to this, the bonding arrangement is further heated immediately to the bonding temperature $T_f$ once the lead temperature $T_{vh}$ has been reached, the temperature curve follows the broken line. Once the bonding temperature $T_f$ has been achieved at time $t_3$ (when the arrangement has dwelt for the time $t_2-t_1$ at the lead temperature $T_{vh}$) or respectively at time $t_{3'}$ (when the arrangement has been heated further immediately to the bonding temperature $T_f$ once the lead temperature $T_{vh}$ has been obtained), the arrangement is held at this temperature until the bonding process at time $t_4$ has been completed (when the arrangement has dwelt at the lead temperature $T_{vh}$ for the time $t_2-t_1$) or respectively at time $t_{4'}$ (when the arrangement has been heated further immediately to the bonding temperature $T_f$ once the lead temperature $T_{vh}$ has been obtained). The cooling phase begins at the point in time $t_4$ or respectively $t_{4'}$. The bonding arrangement is cooled at a predetermined cooling rate and reaches the temperature $T_0$ at time $t_5$ (when the arrangement has dwelt at the lead temperature $T_f$ for the time $t_2-t_1$) or respectively at the time $t_5$ (when the arrangement has been heated further immediately to the bonding temperature $T_f$ once the lead temperature $T_{vh}$ has been obtained).

A. TEST CONDITIONS a. Basic Materials and Sample Designs:

In principle, it is possible to bond stainless steels, the most varied nickel alloys as well as pure nickel using the bonding method according to the invention. For example, bonding tests were carried out using metal strips, sample cylinders and components produced from stainless steel (material number 1.4404), the nickel alloy Hastelloy® C-4 (material number 2.4610) and pure nickel.

b. Creating the Bonding Layers by Means of Metal Plating:

$NiP_x$ layers with a layer thickness of from 3 to 5 µm were plated using an electroless metal plating bath. The NiChem PF 500 bath (Atotech Deutschland) was used for this purpose (Ni content, 5.6 g/l, sodium hypophosphite as the reducing agent, T: 82-90° C., pH: 4.6-4.9, phosphorous content in the deposited layer: x=7-14 percent by weight).

In order to coat the samples with $NiP_x$, they were pretreated beforehand with the methods specified in Tables 1 and 2. The baths referred to Uniclean® (trade name of Atotech Deutshland, DE), 155 (hot degreasing). Uniclean® 675 (acid etch/activation), Uniclean® 279 as well as Nonacid® (trade name of Atotech Deutschland, DE; both electrolytic degreasing baths) are products made by Atotech Deutschland. The nickel strike bath is a commercially available electrolytic nickel plating bath (Watts-type), with which a highly active nickel layer is applied to the metal sample in order to prepare the surface for the subsequent coating. Without this nickel pre-plating, neither nickel nor $NiP_x$ can be applied to the passive material.

TABLE 1

Method for the pre-treatment of stainless steel (1.4404) for the NiP$_x$ coating

| Bath | pH value | Temperature [° C.] | Current density [A/dm$^2$] | Length of treatment [minutes] |
|---|---|---|---|---|
| Uniclean ® 155 (6%) | ≈14 | 60 | ./. | 10 |
| Nonacid ® 701 | ≈13 | 55 | 7-15 | 2 |
| Nickel strike | ≈1 | 40 | 1 | 1 |

TABLE 2

Method for the pre-treatment of Hastelloy ® C-4 and nickel plating for the NiP$_x$ coating

| Bath | pH value | Temperature [° C.] | Current density [A/dm$^2$] | Length of treatment [minutes] |
|---|---|---|---|---|
| Uniclean ® 155 (6%) | ≈14 | 60 | ./. | 10 |
| Uniclean ® 675 | ≈1 | RT | — | 1 |
| Uniclean ® 279 | ≈13 | 40 | 5-15 | 2 |
| Nickel strike | ≈1 | 40 | 1 | 1 |

The thickness of the respective layers was determined by means of XRF (X-ray fluorescence spectroscopy) and by producing a cross section and the optical quality was determined under a light-optical microscope or a scanning electron microscope.

c. Bonding Process:

The samples, provided with the respective bonding layers, were bonded in a heat treatment furnace with the parameter specified in the examples. Once the samples had been heated up the bonding temperature, they were held at the bonding temperature for a holding period. Graphite holders were used to secure the samples. Ceramic plates or respectively boron nitride spray was used to separate the metal samples from the holding material. The necessary contact pressure was applied by placing weights of corresponding mass in position.

d: Quality of the Bonding Connection:

To evaluate the quality of the bonding connections, in each case cross sections were prepared over the bonding zones and tested by means of optical or respectively scanning electron microscopy. Bonded components were also tested with air pressure (3 bar) for tightness. The maximum hydrostatic bursting pressure which the bonded components could resist was then determined at a burst stand.

B. EXAMPLES ACCORDING TO THE INVENTION

Bonding A (with No Dwell Time at the Lead Temperature):

Example 1

Figure 2:
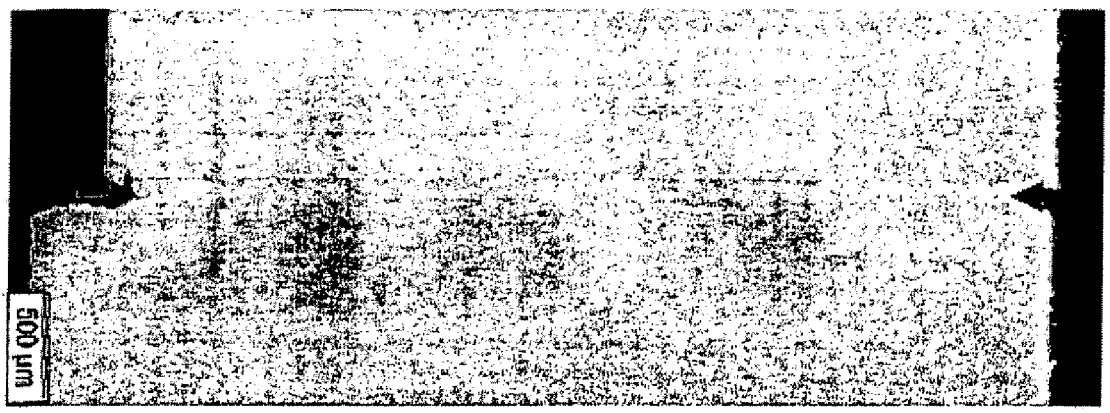
FIG. 2 shows a scanning electron microscope image of a bonding zone of a bonded sample cylinder made from Hastelloy® C-4 in accordance with Example 1.

Bonding sample cylinders made of Hastelloy® C-4:
 NiP$_x$ layer thickness: 3 μm
 Contact pressure: 1400 kPa
 Heat at 25 K/min to 1100° C.
 Hold at 1100° C. for 4 h
 Cool at 25 K/min FIG. 2 shows a scanning electron microscopy image of the bonding zone obtained. There is no boundary face to be seen between the bonded cylinders. Consequently, this is a monolithic structure.

Example 2

Figure 3:
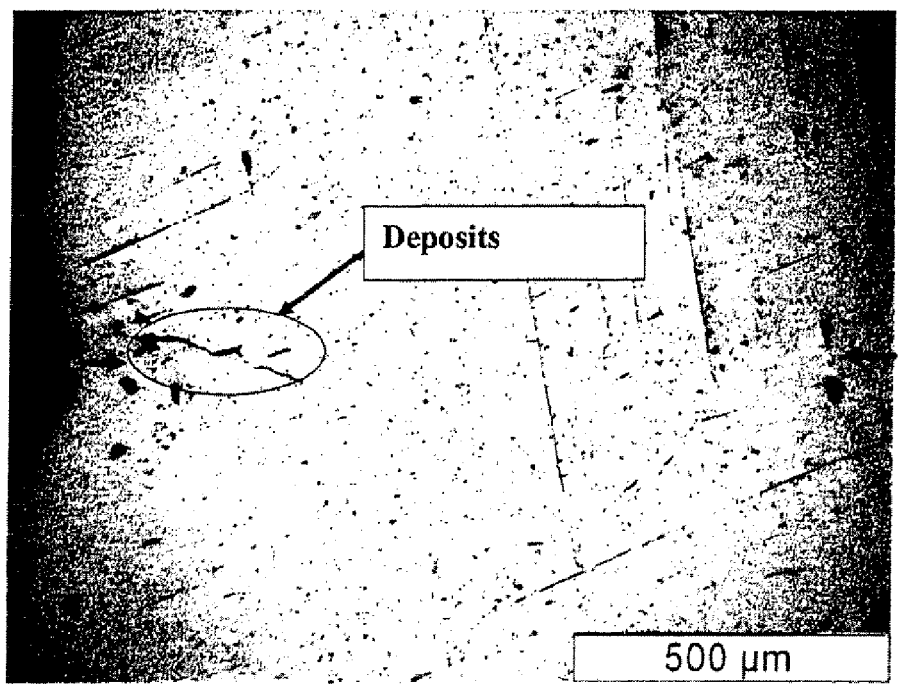
FIG. 3 shows a light microscopy image of a bonding zone of a bonded component made of Hastelloy® C-4 in accordance with Example 2.

Bonding a Component Made from Hastelloy® C-4:
 NiP$_x$ layer thickness, 4.4 μm
 Contact pressure: 30 kPa
 Heat at 10 K/min to 800° C.
 Continue to heat at 5 K/min to 1100° C.
 Hold at 1100° C. for 1 h
 Cool at 25 K/min FIG. 3 shows a light-microscopy image of the bonding zone obtained. Apart from monolithic regions (right-hand side) small isolated deposits can also be seen (left-border). The said small island-like deposits do not compromise the material characteristics. The black dots on the image are artefacts caused by the preparation. Components bonded in this manner were air-tight and showed burst values in excess of 300 bar.

Example 3

Figure 4:
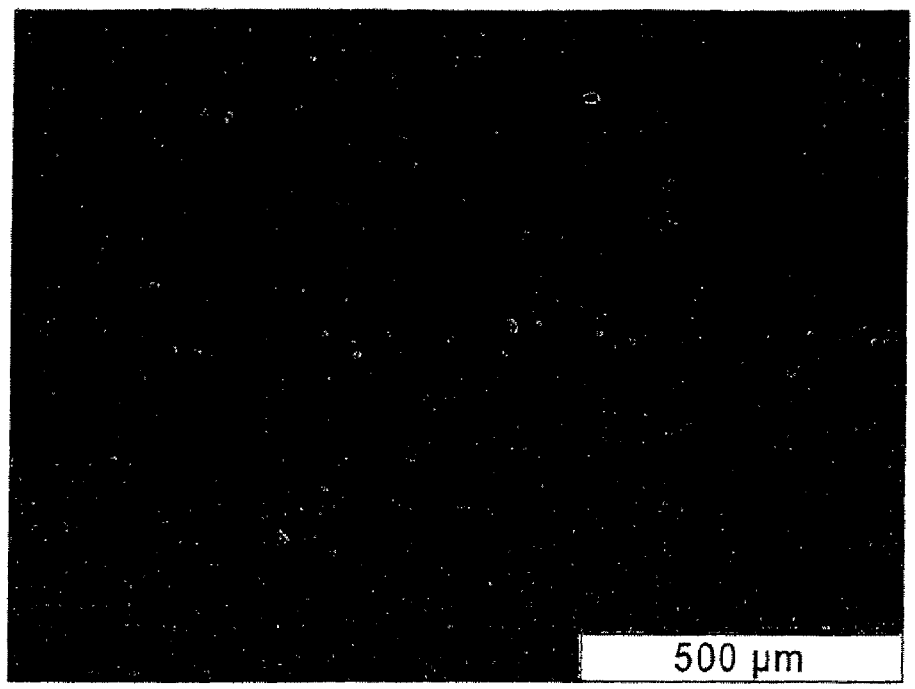
FIG. 4 shows a light microscopy image of the bonding zone of bonded sheet metal strips made of pure nickel in accordance with Example 3.

Bonding metal strips made from pure nickel:
 NiP$_x$ layer thickness: 4.8 μm
 Contact pressure: 30 kPa
 Heat at 10 K/min to 800° C.
 Heat further at 5 K/min to 1100° C.
 Hold at 1100° C. for 1 h
 Cool at 25 K/min FIG. 4 shows a light microscopy image of the bonding zone. The boundary face is no longer visible. Consequently, this is a monolithic bonding seam.

Example 4

Figure 5:
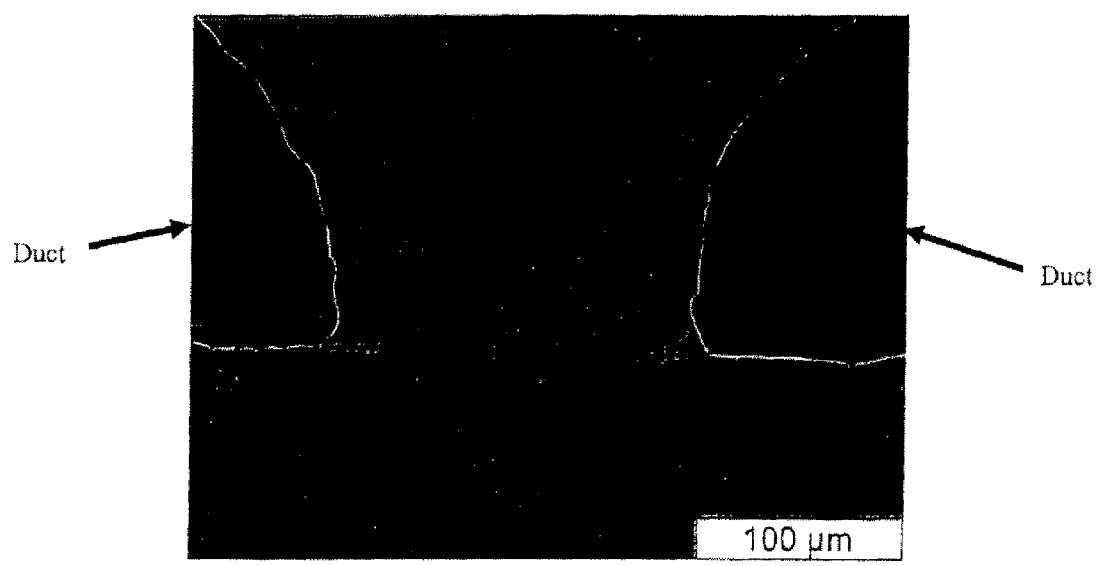
FIG. 5 shows a light microscopy image of one of the bonding zones of a bonded component made of stainless steel (1.4404) in accordance with Example 4.

Bonding a component made of stainless steel (1.4404):
 NiP$_x$ layer thickness. 4.5 μm
 Contact pressure: 30 kPa
 Heat at 10 K/min to 800° C.
 Heat further at 5 K/min to 1100° C.
 Hold at 1100° C. for 1 h
 Cool at 25 K/min FIG. 5 shows a light microscopy image of one of the bonding zones. No boundary face is visible. Consequently this is a monolithic structure. The burst values analogous to the bonded components were in excess of 299 bar.

Bonding B (with Dwell Time at the Lead Temperature):

Example 5

Figure 6:
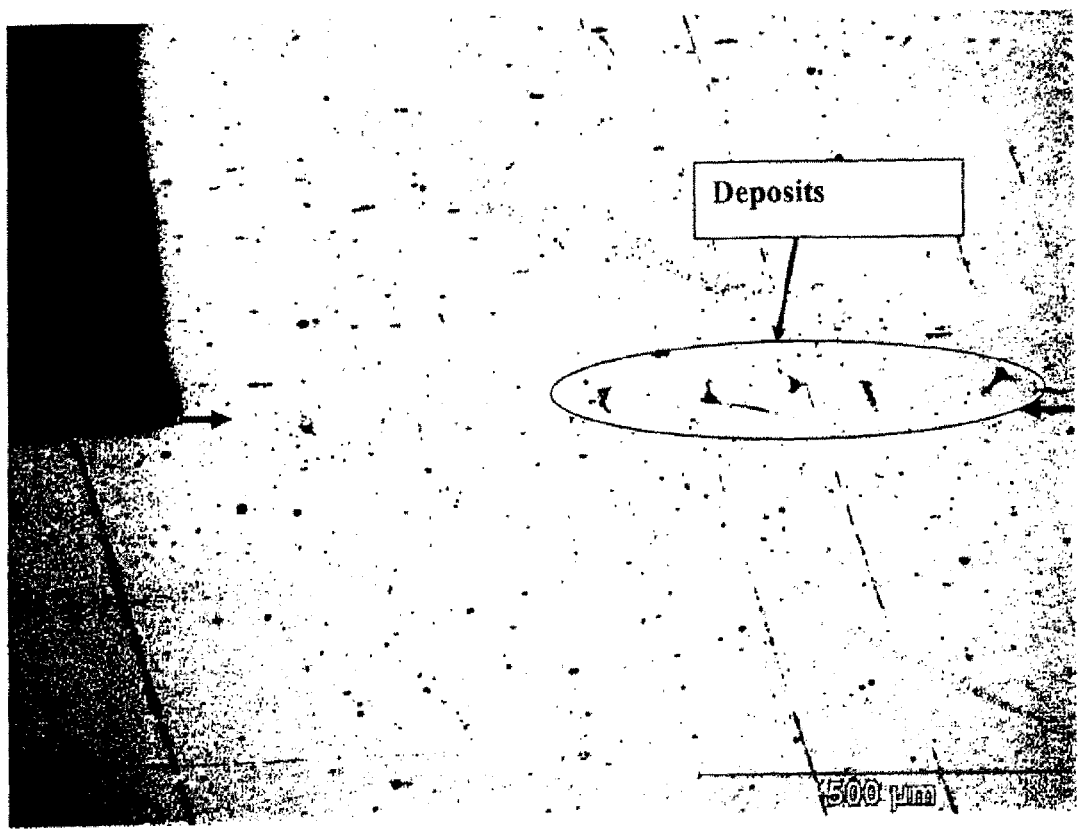
FIG. 6 shows a light microscopy image of one of the bonding zones of a bonded component made from Hastelloy® C-4 in accordance with Example 5.
Figure 7:
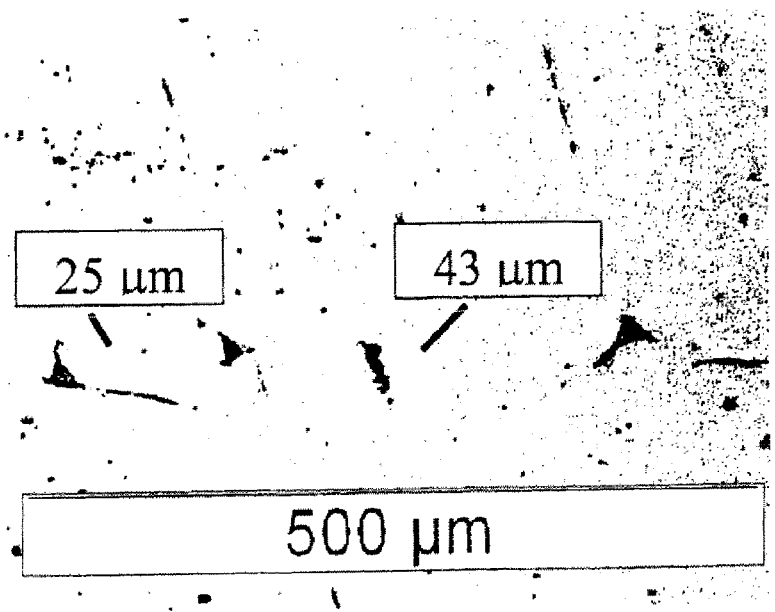
FIG. 7 shows an enlarged section from FIG. 6 with two measurements of the size of the deposits as an example.

Bonding a component made of Hastelloy® C-4:
 NiP$_x$ layer thickness: 4.5 μm
 Contact pressure: 30 kPa
 Heat at 10 K/min to 800° C.
 Hold at 800° C. for 45 min
 Heat further at 5 K/min to 1100° C.
 Hold at 1100° C. for 1 h
 Cool at 20 K/min FIG. 6 shows a light microscopy image of one of the bonding zones. Apart from monolithic regions (left border) small deposits are also visible (right-hand side). FIG. 7 shows an enlarged section from FIG. 6 with two measurements of the size of the deposits as examples. The deposits are clearly smaller that the critical phase expansion of brittle phases. A component bonded in this manner had a burst value of 207 bar.

Figure 8:
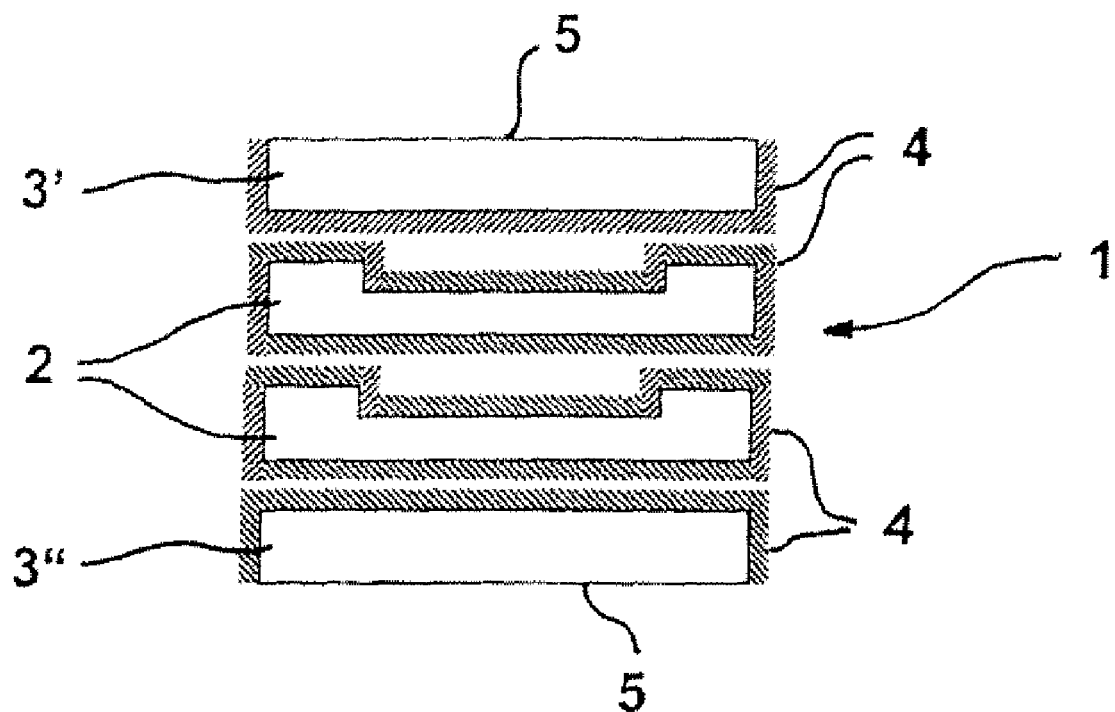
FIG. 8 shows a schematic representation of duct plates of a micro-structured component with a one-sided coating on the bottom and top plates with bonding layers (first specific embodiment)
Figure 9:
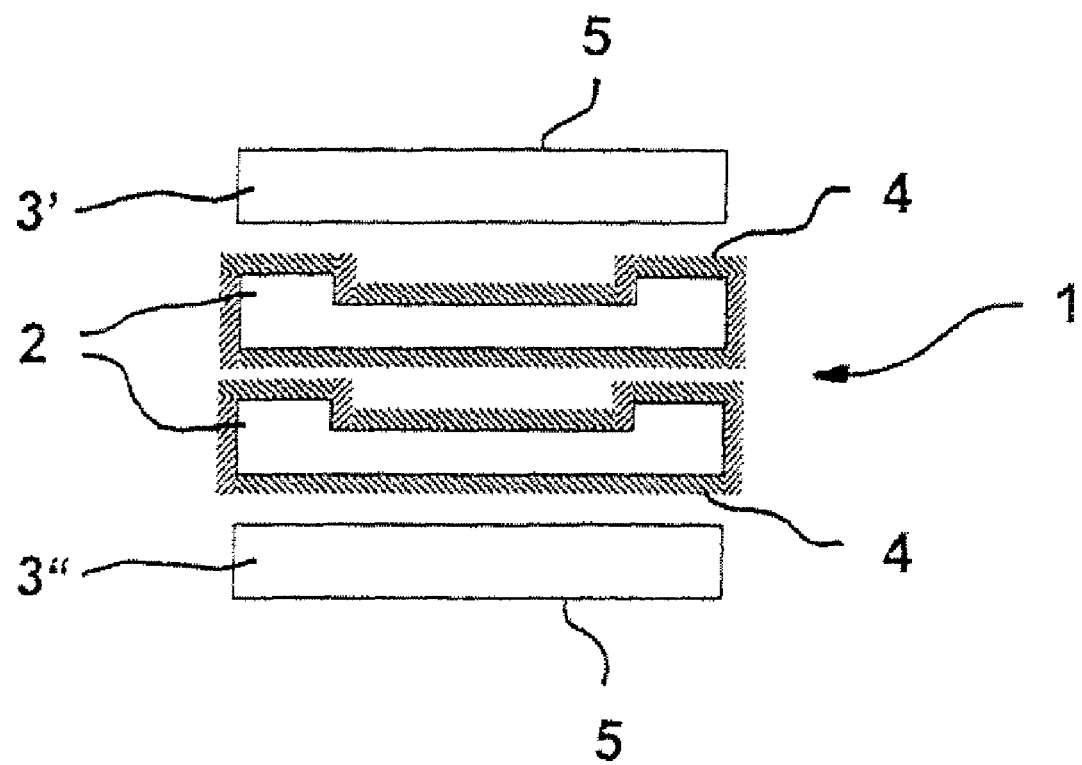
FIG. 9 shows a schematic representation of duct plates of a micro-structured component with no coating on the bottom and top plates with bonding layers (second specific embodiment).

FIGS. 8 and 9 are sectional representations shown in a schematic manner of stacks 1 of micro-structured duct plates 2 (inner plates) and respective outer plates 3', 3" at for a micro-structured component. The individual plates 2, 3', 3" at are shown in exploded view to make the applied bonding layers 4 more recognisable. The two representations differ from one another with regard to the application of bonding layers (solder) 4 onto the inner plates 2 and the outer plates 3', 3" in the stack.

In a first method variant as shown in FIG. 8, the inner duct plates 2 were coated over their entire surface. The outer plates (bottom plate 3" and top plate 3'), before the coating with the bonding layer 4 (grey hatching), were protected in each case on the outer sides 5, for example by means of a resist (not shown) so that no bonding layer was deposited on the exterior faces.

In a second method variant as shown in FIG. 9, only the inner duct plates 2 were provided over the entire surface with the bonding layer 4 (grey hatching), whilst the outer plates (bottom plate 3" and top plate 3') remained completely free of the bonding layer. It has been shown that a firm bond can be obtained in this variant also. An advantage of variant 2 is simpler process management as the bottom plate 3" and the top plate 3' were not provided with a bonding layer nor was it necessary to provide a resist.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

The invention claimed is:

1. Method for bonding at least two work pieces made of stainless steel, nickel or nickel alloys, the said method comprising the following method steps:
   a) providing said at least two work pieces;
   b) forming a respective metal bonding layer on at least one side of at least one of said at least two work pieces by means of a chemical or electrolytic metal plating method, wherein the metal bonding layer consists of a nickel/phosphorous alloy having a phosphorous content within a range of from about 1 to about 14 percent by weight and has a thickness within a range of from about 0.5 to about 10 μm;
   c) forming a bonding arrangement comprising said at least two work pieces in such a manner that there is at least one metal bonding layer between said at least two respective work pieces;
   d) heating the bonding arrangement at a heating rate of from about 5 to about 30 K/min to a bonding temperature in excess of the melting temperature of the metal bonding layer;
   e) bonding said at least two work pieces at the bonding temperature by applying contact pressure of at least about 10 kPa;
   f) cooling the bonding arrangement at a cooling rate within a range of from about 10 to about 100 K/min.

2. Method according to claim 1, characterised in that the nickel alloy is a super alloy having less than about 50 percent by weight iron content.

3. Method according to claim 1, characterised in that the nickel content of the nickel alloy is at least about 28 percent by weight.

4. Method according to claim 1, characterised in that at least one bonding layer is a nickel/phosphorous alloy having a phosphorous content within a range of from about 8 to about 12 percent by weight.

5. Method according to claim 1, characterised in that the chemical metal plating method is an electroless metal plating method.

6. Method according to claim 1, characterised in that the electroless metal plating method is carried out by using a bath, containing a nickel salt and sodium hypophosphite as the reducing agent.

7. Method according to any claim 1, characterised in that the thickness of at least one metal bonding layer is within a range of from about 2 to about 5 μm.

8. Method according to claim 1, characterised in that the thickness of at least one metal bonding layer is within a range of from about 1 to about 2 μm.

9. Method according to claim 1, characterised in that the bonding temperature is within a range of from about 1050 to about 1150° C.

10. Method according to claim 1, characterised in that the bonding arrangement is bonded whilst applying a contact pressure within a range of from about 20 to about 300 kPa.

11. Method according to claim 1, characterised in that the bonding arrangement is heated in method step (d) whilst applying a contact pressure of at least about 10 kPa.

12. Method according to claim 1, characterised in that the bonding arrangement is bonded for a period of from about 15 min to about 4 hours.

13. Method according to claim 1, characterised in that the bonding arrangement is bonded for a period of from about 45 to about 90 minutes.

14. Method according to claim 1, characterised in that the bonding arrangement is cooled at a cooling rate of from about 15 to about 25 K/min.

15. Method according to claim 1, characterised in that the bonding arrangement is heated initially to a lead temperature within a range of from about 700 to about 900° C., the said lead temperature being lower than the bonding temperature and lower than the melting temperature of the bonding layer, and is then heated to the bonding temperature.

16. Method according to claim 15, characterised in that the bonding arrangement is heated to the lead temperature at a heating rate within a range of from about 5 to about 30 K/min.

17. Method according to claim 1, characterised in that said work pieces are disposed in a stack and in that said work pieces are inner layers and outer layers, which border the said inner layers and which have inner sides that are in contact with said inner layers, and in that at least one metal bonding layer is formed over the entire surface of at least one side of each inner layer and in that at least one metal bonding layer is formed only on said inner sides of each outer layer.

18. Method according to claim 1, characterised in that said work pieces are disposed in a stack and in that said work pieces are inner layers and outer layers, which border the said inner layers and which have inner sides that are in contact with said inner layers, and in that at least one metal bonding layer is formed over the entire surface of at least one inner layer and in that no bonding layer is formed on said outer layers.

19. Method according to claim 1, characterised in that each one of said at least two work pieces are provided with at least one bonding region, in which one of said at least two work pieces is bonded to the respective other one and in that at least one metal bonding layer is formed exclusively in each one of said at least one bonding region.

20. Method according to claim 1, characterised in that the at least two work pieces are bonded until the metal bonding layer can be made no longer substantially visible in a cross section.

21. Method for producing a micro-structured component, selected from the group comprising micro-reactors, micro-heat exchangers and micro-mixers, the said method comprising the following method steps:
   a) carrying out the method according to claim 1, wherein the work pieces are provided before method step (c) with indentations for forming passages;
   b) providing connecting means for the inlet and outlet of fluids into the passages or respectively out of the passages.

\* \* \* \* \*

UNITED STATES PATENT AND TRADEMARK OFFICE
CERTIFICATE OF CORRECTION

PATENT NO. : 8,042,726 B2
APPLICATION NO. : 12/307939
DATED : October 25, 2011
INVENTOR(S) : Ralph Herber et al.

It is certified that error appears in the above-identified patent and that said Letters Patent is hereby corrected as shown below:

Title page, Item (75) the inventor's name "Gerd Schafer" should read --Gerd Schäfer--.

Column 1, line 26, "include, i.e., nickel/chromium" should read --include, i.a., nickel/chromium--.

Column 5, line 7, "DE 198 31 374 C1" should read --DE 198 01 372 C1--.

Column 12, line 51, "produce the component is" should read --produce the components is--.

Column 14, the last sentence before the section heading "A. TEST CONDITIONS," the second instance of "$t_5$" should read --$t_{5'}$--.

Column 15, line 34, "with the parameter" should read --with the parameters--.

Column 16, line 67, "at for a" should read --for a--.

In claim 1, column 17, line 54, "applying contact" should read --applying a contact--.

Signed and Sealed this
Second Day of October, 2012

David J. Kappos
*Director of the United States Patent and Trademark Office*